United States Patent [19]

Hendrickson

[11] 4,169,273
[45] Sep. 25, 1979

[54] PHOTODETECTOR SIGNAL PROCESSING

[75] Inventor: Thomas E. Hendrickson, Wazata, Minn.

[73] Assignee: Honeywell Inc., Minneapolis, Minn.

[21] Appl. No.: 918,973

[22] Filed: Jun. 26, 1978

[51] Int. Cl.² .............................................. H04N 3/14
[52] U.S. Cl. ................................. 358/213; 250/211 J; 357/30
[58] Field of Search ................. 358/213; 357/24, 30, 357/32; 250/211 J, 578

[56] References Cited

U.S. PATENT DOCUMENTS

| 3,896,485 | 7/1975 | Early | 358/213 |
|---|---|---|---|
| 3,931,463 | 1/1976 | Levine | 358/213 |
| 3,932,775 | 1/1976 | Kosonocky | 358/213 |
| 3,995,302 | 11/1976 | Amelio | 358/213 |
| 4,011,442 | 3/1977 | Engeler | 358/213 |
| 4,071,853 | 1/1978 | Yamanaka | 358/213 |

*Primary Examiner*—David L. Stewart
*Attorney, Agent, or Firm*—Theodore F. Neils

[57] ABSTRACT

A signal processor is disclosed for operating on signals provided by a photodetector, particularly photodetectors, or arrays thereof, for use in image processing. The processor is particularly well implemented by use of charge-coupled device technology for sampling and processing the photodetector signals. The photodetector signals are sampled many times in a frame to provide a combined result representation of an image element in that frame to thereby reduce noise associated therewith.

58 Claims, 7 Drawing Figures

PHOTODETECTOR SIGNAL PROCESSING

BACKGROUND OF THE INVENTION

The present invention relates to processing photodetector signals, particularly photodetector signals from photodetectors in arrays of photodetectors which are used as image plane staring sensors and where there is a large background component in the image. More particularly, the signal processor of the present invention is especially used in connection with infrared staring sensors.

The use of charge-transfer device technology to process signals obtained from photodetectors has a number of advantages. First, charge-transfer devices, particularly charge-coupled devices, can be relatively easily fabricated in silicon monolithic integrated circuits and fabricated such that these devices individually are capable of being provided therein in a high density. The charge-transfer device with respect to analog signals, is basically a sampling device directly manipulating the analog samples. Thus, the interface between such a device and the photodetector can be relatively uncomplicated since the photodetector, typically, provides an analog electrical output signal more or less related to that electromagnetic energy which is to be sensed. Further, the analog samples to be manipulated in the charge-transfer device can be controlled by digital clocking circuits which permit considerable flexibility in treating the analog samples.

However, there are difficulties in processing photodetector output signals, particularly infrared photodetector output signals. In processing these signals, there is the problem that the signals reflect the low contrast generally occurring in infrared scene image coupled with a very large background radiation portion also occurring therein. This situation leads to changing signals representing scene image details and changes, which are relatively small because of the low contrast, coupled with a large and relatively constant signal component due to the large background portion. As a result, direct coupled staring sensors have difficulty distinguishing between variations in detector responsivity among photodetectors present within the array versus actual variations in image irradiance. Thus, there is a stringent limitation on the variance among detector responsivities in such a system if other measures are not taken.

A typical arrangement is to use a two-dimensional photodetector array in a mechanically scanned arrangement. This arrangement is used with the time delay and integration (TDI) signal processing method to improve the signal strength relative to the noise, coupled with use of capacitive coupling (AC coupling) between the photodetectors and charge-coupled device signal processing circuitry to remove relatively constant signal portions.

Alternatively, to avoid scanning, staring sensors are used with capacitive coupling between the photodetectors and a charge-coupled device processing structure to thereby eliminate the steady background signal, the latter structure being used as a multiplexor. Often with, or as an alternative to capacitive coupling, a substantial amount of analog or digital processing is required at the output of the charge-coupled device signal processor to provide signal enhancement. This processing at the output may leave the charge-coupled device, in handling the background signal component in each sample, requiring in its structure rather large sample storage well electrodes. A typical processing method is to subtract successive scene frame values from one another so that only the changes are kept, frames being defined as time periods of successive "snapshots" of the image scene in time, i.e., as times of successive samples of the scene image. Another alternative is to subtract from a frame value a "blanked" frame value representing the background level, or to subtract therefrom a reference level either derived from the scene in some other way or somehow otherwise estimated. A method to reduce the required digital processing, and which can reduce the size of the storage well electrodes in the charge-coupled device in a monolithic integrated circuit, is to use a charge skimming technique where a portion of the sample of the image scene corresponding to the background is removed with each sampling.

Another problem in the use of charge-transfer devices in signal processors for infrared photodetectors is the problem of bright spots occurring in the image scene. The result is "blooming" or the overflow of charge, representing a sample of a bright spot in the scene viewed, from storage wells holding that sample into adjacent storage wells. The result is the obliterating of the representation of other portions of the scene associated with the adjacent storage well, and so the distorting of a substantial portion of the image scene. A number of special purpose circuits have been devised for controlling such "blooming".

There is a substantial need for a better and more efficient signal processor for use with a staring sensor, thereby avoiding the need for mechanical scanning, which can also overcome the problems of low contrast and "blooming". Further, such a signal processor is desired to be as small as possible to promote the greatest density of photodetector elements in the image array associated with the processor where this array is to be provided at the focal plane of a system receiving electromagnetic energy from which to form an image.

SUMMARY OF THE INVENTION

The present invention contemplates sampling a photodetector output signal a large number of times in any frame and then combining these samples to form the frame combined representation of the image scene portion falling on this photodetector. The arrangement permits transferring, as a data element representing the scene portion, the combined frame representation during further photodetector signal sampling for the next frame combined representation. Thus, the signal processor and the photodetector associated therewith can spend all, or nearly all, of the time in any one frame "staring" at the image scene portion falling on the photodetector element. Relatively low frame rates can be achieved by eliminating much of the background portion of the photodetector output signal so that those photodetector output signal frequency portions, beyond the relatively low frequencies of interest comprising the desired signal, can, to a substantial degree, be eliminated.

The signal processor may be advantageously implemented in a charge-transfer device, particularly in a monolithic integrated circuit involving both surface-channel charge-coupled devices and buried-channel charge-channel coupled devices. The photodetector output signal is received in an open circuit arrangement at a storage well electrode in a charge-transfer device for sampling and forming a frame combined representation. This frame combined representation is transferred out for further use by another charge-transfer device. The charge-transfer device receiving the photodetector output signal can advantageously be a surface-channel charge-coupled device while the charge-transfer device for transferring the combined frame representation can advantageously be a buried-channel charge-coupled device. Further, background signal portions may be removed to a desired degree by selectively biasing another storage well electrode in the charge-transfer device receiving the photodetector output signal. This removal can be done adaptively by use of a background sensor, i.e., background photodetector, to bias this latter storage well electrode.

DESCRIPTION OF THE PREFERRED EMBODIMENTS

Figure 1:
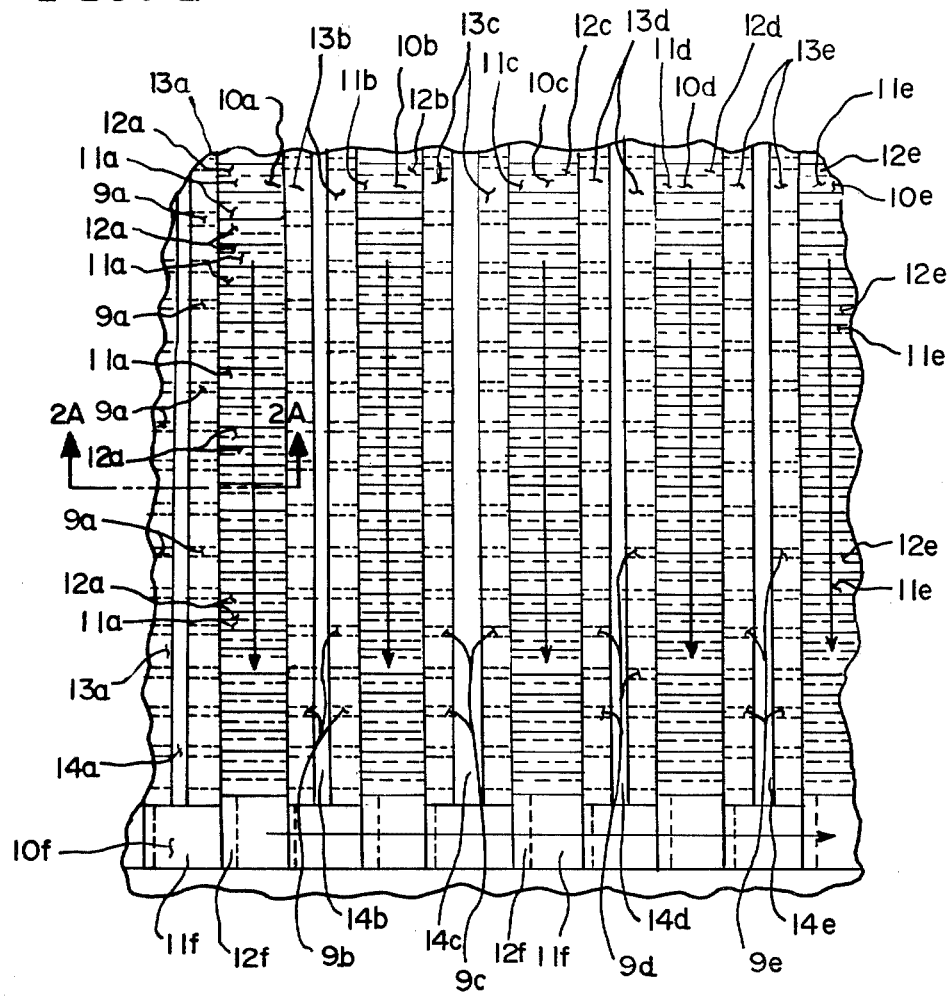
FIG. 1 represents a diagrammatic plan view of a portion of a monolithic integrated circuit implementing the present invention.

FIG. 1 shows a portion of the layout scheme for a charge-coupled device monolithic integrated circuit provided in and on a semiconductor material substrate and serving as the input signal processor of the present invention. Typically, an array of photodetector elements would be provided each in rigid contact with the monolithic integrated circuit structure shown in FIG. 1, on the exposed face thereof, and hence, have not been shown in FIG. 1 to avoid obliterating the detail shown there.

The vertical columns labeled $10a$, $10b$, $10c$, $10d$, and $10e$ represent buried-channel charge-coupled devices used in transferring charge packets representing portions of the image scene falling on the set or array of photodetectors. Each such charge packet represents a sample taken of an image portion occurring on one photodetector in one of a sequential group of time periods called frames. These charge packets, to be called frame combined representations for reasons set out below, represent the signal information in analog, sampled data form as obtained in each frame from each photodetector element in the array on which a scene image portion is provided by the sensing system of which the input signal processor is a part. A typical choice for a frame rate would be to match that used in commercial television systems—leading to a frame rate of 60 frames per second—so that a commercial television set could be used as the sensing system output. The buried-channel charge-coupled devices $10a$, $10b$, $10c$, $10d$ and $10e$, as seen in this view, have only storage well electrodes directly visible and these are shown in solid lines. These visible electrodes will be individually designated herein by primes on the complete charge-coupled device structure designations, i.e., $10a'$, $10b'$, etc., when referred to.

For each frame, each of the obtained frame combined representations obtained therein (one from each photodetector in the array thereof) is shifted down one of the vertical charge-coupled device structures $10a$, $10b$, $10c$, $10d$, and $10e$, in the direction of the arrows shown thereon in FIG. 1, to be collected in the horizontal charge-coupled device structure, $10f$. The frame combined representations are thereafter shifted along the direction of the arrow shown on structure $10f$ to a receiver means for use as data elements representing the various scene image portions at the time of the corresponding frame. The storage well electrodes for structure $10f$, visible in FIG. 1, are again shown by solid lines and are to be designated individually by $10f'$.

The structures $10a$, $10b$, $10c$, $10d$, $10e$, and $10f$ are all buried-channel charge-coupled devices operated by two-phase clocking signals as shown in FIG. 1. Thus, each storage well electrode in these charge-coupled device structures requires a storage region and a barrier region in the substrate underneath, the storage regions being designated by $11a$, $11b$, $11c$, $11d$, $11e$, and $11f$. The barrier regions are designated by $12a$, $12b$, $12c$, $12d$, $12e$, and $12f$. These buried-channel charge-coupled devices could alternatively be of the type using a larger number of clocking phases so that barrier regions would not be needed.

Adjacent to the vertical charge-coupled device structures are column pairs of input structures, $13a$, $13b$, $13c$, $13d$, and $13e$. Each of the vertical column pair members in these column pairs of input structures are separated from one another by a source region input diode region, these regions being designated $14a$, $14b$, $14c$, $14d$, $14e$. Each of the column pairs, on the other hand, is separated by one of the vertical charge-coupled device structures $10a$, $10b$, $10c$, $10d$, or $10e$. Further, each vertical column pair member in each pair of input structure columns is separated into individual input structures by channel stops, $9a$, $9b$, $9c$, $9d$, and $9e$. Input structure column pairs $13a$, $13b$, $13c$, $13d$ and $13e$ contain surface-channel charge-coupled device structures as the individual input structure using the corresponding source regions $14a$, $14b$, $14c$, $14d$ and $14e$ as part of the input diode found in each individual input structure.

Figure 2A:
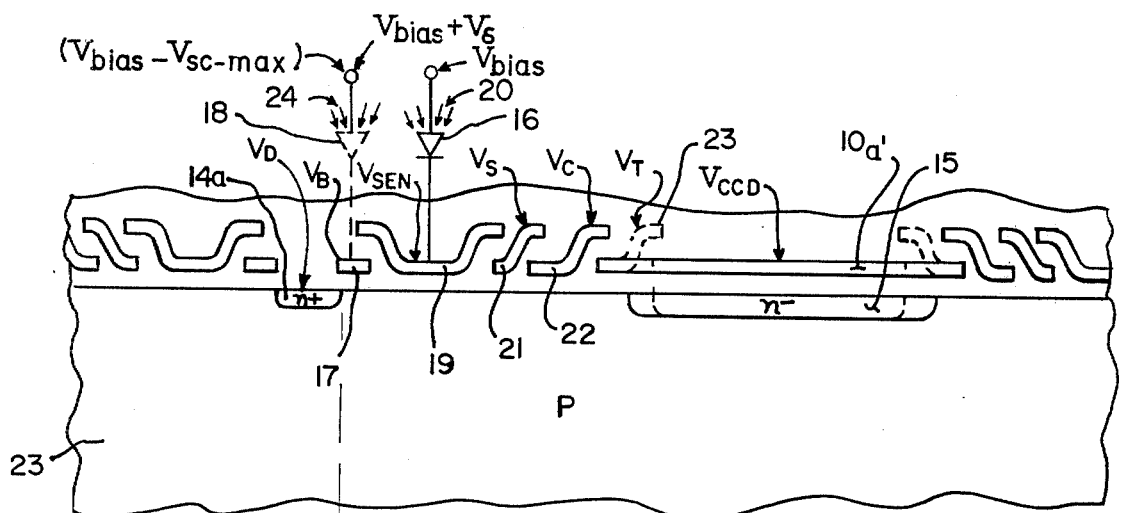
FIGS. 2A and 2B represent a diagrammatic cross section view of a portion of FIG. 1 showing the present invention and a series of minimum value point electron potential profiles showing the potential wells under corresponding storage well electrodes.

These individual input structures can be more fully understood by turning to FIG. 2A where a cross section of a portion of FIG. 1 is shown. There can be seen a p-type semiconductor body, 23, in which there is provided a buried-channel storage region, 15, as a part of the vertical buried-channel charge-coupled device structure $10a$ of FIG. 1 where this storage region was designated $11a$. Also shown is source region $14a$ as a part of the surface-channel charge-coupled device forming an individual input structure in one of the vertical column pair members of input structure column pair $13a$. This input structure comprises the portions between input diode region $14a$ and buried-channel charge-coupled device electrode $10a'$, a structure which can be seen in FIG. 2A to be a surface-structure channel charge-coupled device.

In this arrangement, the photodetector element, 16, here a photodiode, provides its output signal to the surface-channel charge-coupled device of FIG. 2A forming the individual input structure in the vertical column pair member of the column pair in FIG. 1 designated $13a$. The initial processed result from this output signal is provided to electrode $10a'$ of the buried-channel charge-coupled device structure 10a of FIG. 1. This arrangement has two advantages. First, the charge induced in the surface-channel charge-coupled device by the output signal of photodetector 16 will more linearly represent that output signal than it would if the detector 16 were to be connected instead directly into a buried-channel charge-coupled device. This is because the input storage potential well of the surface-channel charge-coupled device is formed by a much more nearly linear capacitance under the sensing input storage well electrode, 19. This is true since this capacitance is based on only the oxide layer between this electrode and substrate 23 as the capacitance dielectric, whereas storage well capacitance in a buried-channel charge-coupled device has a much more nonlinear capacitance. This nonlinearity is due to not only to a similar oxide being present as part of the capacitance dielectric, but there also being present as a part of the dielectric, in operation, a depleted region of the semiconductor material located about the buried channel region necessary for a buried-channel charge-coupled device. On the other hand, the buried-channel charge-coupled device has a considerably better transfer efficiency than does a surface-channel charge-coupled device because charge transfer in the former device is not affected by surface states in the semiconductor material immediately present under the oxide as is charge-transfer in surface-channel charge-coupled devices.

Of course, there is no prohibitive reason that one could not use a different arrangement of charge-coupled devices, an arrangement that would still operate but likely with a somewhat degraded performance. Hence, both the input structure charge-coupled device and the transfer charge-coupled device could both be surface-barrier charge-coupled devices. Alternatively, they could both be buried-channel charge-coupled devices, or even be one of each reversed in kind from that shown in FIG. 2A.

All of the individual input structures in column pair 13a of FIG. 1 share input diode region 14a as indicated above. Region 14a is to be operated with a varying voltage designated $v_D$, here a pulsating voltage or voltage oscillating between a positive value and zero volts or ground.

The surface-channel charge-coupled device of FIG. 2A, in addition to region 14a, has several input structure storage well electrodes to be operated with various clocking voltage waveforms. These include a barrier storage well electrode, 17, immediately adjacent to region 14a. Barrier electrode 17 is shown to be operated at a voltage, $V_B$, in FIG. 2A. Also shown in connection with barrier electrode 17, in the alternative, is a dashed-line diode, 18, having its cathode connected to barrier electrode 17. Shown on the anode side of diode 18 are two voltage values to be provided in the alternative. That is, when diode 18 is not present, the voltage value impressed on barrier electrode 17 is $V_B = V_{bias} - V_\delta$ which is a positive, substantially constant voltage. However, when diode 18 is actually used, as will be discussed later, the anode thereof will be biased in one use with a voltage value $V_{bias} - V_{sc-max}$ (and in another by $V_{bias}$) such that $V_B$ has a value determined not only by $V_{bias}$ but also the voltage appearing across diode 18.

Immediately adjacent to barrier electrode 17 is sensing input storage well electrode 19. The voltage on sensing electrode 19 is represented as $V_{SEN}$ and is determined by the voltage applied to the anode of sensing electrode 16, which is $V_{bias}$, and a voltage developed across sensing diode 16 which is determined in part by that which is sensed, here electromagnetic radiation designated 20. Typically, electromagnetic radiation 20 will be infrared radiation to which sensor diode 16 is responsive. While the sensing element shown at FIG. 2A is photodiode 16, there may also be other kinds of sensors used such as a photoconductive resistor. Although $V_{SEN}$ is a positive, substantially constant voltage on electrode 19, one should realize that this voltage will change with the intensity of the image scene portion impinging on sensor diode 16. However, this change will be relatively slow compared to the changes in the clocking waveforms to be applied to the other electrodes in the charge-coupled devices shown here. Hence, $V_{SEN}$ may be considered substantially constant for purposes of an operational description during a frame.

Next, there is immediately adjacent to sensor electrode 19 a sampling input storage well electrode, 21, operated at a varying voltage $v_S$. Immediately adjacent thereto, is a combining input storage well electrode, 22, having a voltage thereon designated $v_C$. Combining electrode 22 is also immediately adjacent to electrode 10a' of buried-channel charge-coupled device structure 10a. The varying voltage on electrode 10a' is designated by $v_{CCD}$.

Figure 3:
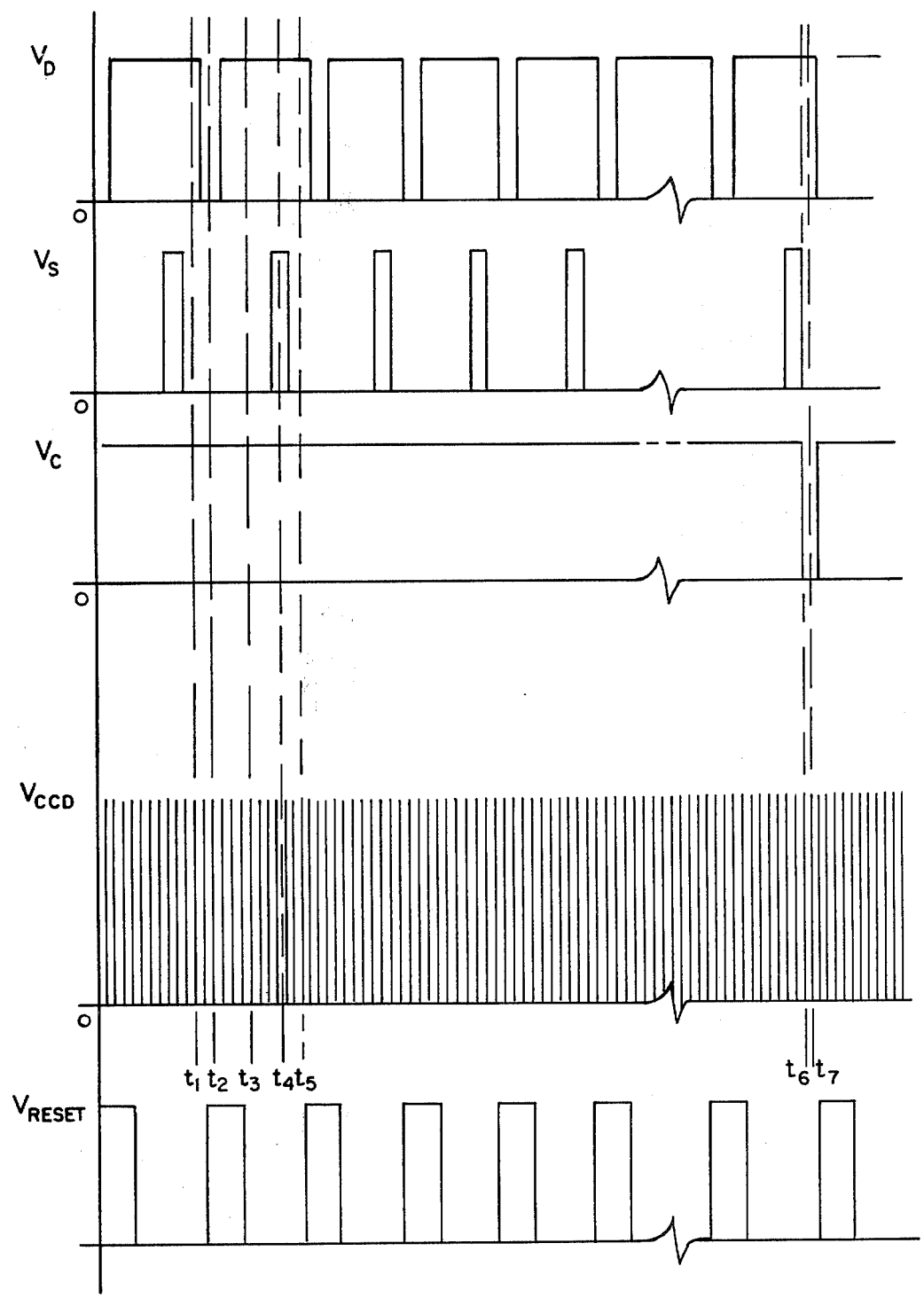
FIG. 3 shows a series of voltage waveforms corresponding to FIG. 2.

FIG. 3 shows all of the varying or pulsating voltage waveforms over time appearing on (i) the input storage well electrodes of the individual input structure surface-barrier charge-coupled device in FIG. 2A, and (ii) on the storage well electrode 10a' of the buried-channel charge-coupled device structure 10a. The time duration shown is approximately one frame, that is, the time required to obtain one sample of the scene image portion falling on sensor 16. The substantially constant voltages $V_B$ and $V_{SEN}$ are not shown as they would merely appear as horizontal lines. Note that each time axis is broken in FIG. 3 at approximately three-quarters of the way to the right side of those axes indicating that substantial time goes by before the right-hand quarter of FIG. 3 is reached.

Figure 2B:
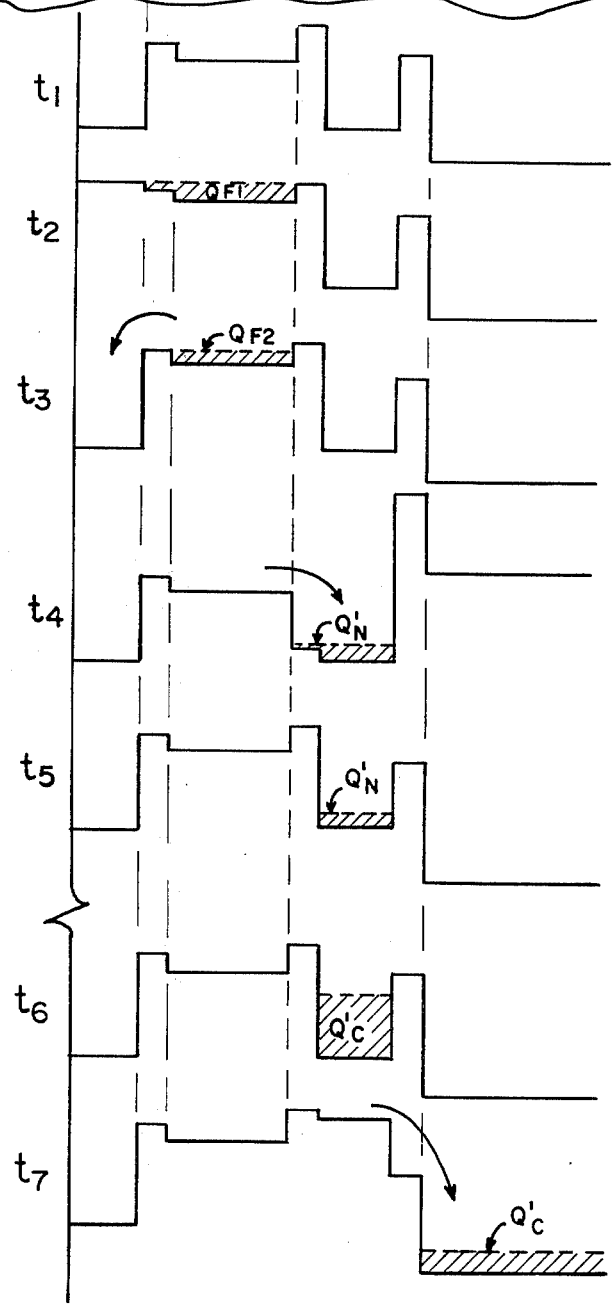

As one can note, several points in time have been marked in FIG. 3 by vertical dashed lines which cross through the various graphs shown for each of the voltages indicated in FIG. 2A. Beneath these dashed lines are designations for the particular points in time chosen, these being $t_1$, $t_2$, $t_3$, $t_4$, $t_5$, $t_6$, and $t_7$. Turning to FIG. 2B, one can see that the same time designations appear on the left side of the minimum valud point electron surface potential profiles which are approximately shown in that figure for (i) the potential of the surface of substrate 23 beneath the input storage well electrodes, and (ii) the potential at the minimum value point in the substrate 23 bulk material beneath the buried-channel charge-coupled device electrode 10a'. Hence, the potential profiles, for the substrate surface beneath each of the input storage well electrodes and a point in the bulk material beneath the electrode 10a', are shown in FIG. 2B for the chosen points in time shown in FIG. 3.

Turning now to the operation of the device shown in FIG. 2A, time $t_1$ represents a point in time when all of the input storage wells and the storage well under electrode 10a' of the buried-channel charge-coupled device are devoid of any charge packets stored thereunder and are ready to begin operation in a new cycle in the operating sequence. In this situation, the voltage value of region 14a, $v_d$, which oscillates between ground or zero volts and a high level voltage (approximately 10.0 volts), is at the high level. This is correspondingly reflected in the surface potential under this region in FIG. 2B being at a low level.

The barrier electrode 17 is assumed, for this operation description, to be directly electrically connected to a voltage source with diode 18 absent. In this circumstance, $V_B = V_{bias} - V_\delta$ where $V_\delta$ represents the maximum scene change signal value and a portion of the relatively constant voltage representing the scene background in the output signal voltage provided by sensing diode 16. The closer that $V_\delta$ covers the scene background voltage from sensor diode 16 the closer the charge packet induced under sensor electrode 19 by the voltage thereon will come to representing only the scene change component of the diode 16 output signal (ignoring potential offsets over time between the barrier and the sensor storage wells due to subthreshold current flow over the barrier). This is because barrier electrode 19 controls the amount of charge to be removed from the storage well beneath sensor electrode 19 as will be discussed below.

Sensor 16, in being connected to sensor electrode 19, is effectively connected to the capacitance formed by electrode 19, substrate 23, and the oxide therebetween which together form the storage well occurring beneath electrode 19. A similar storage well is formed by the other capacitances associated with the other input electrodes in FIG. 2A. In being connected in a single-loop circuit containing a capacitance, sensor 16 is operating in effectively an open circuit situation or in the photovoltaic mode.

Barrier electrode 17 is operated at the substantially constant voltage $V_B = V_{bias} - V_\delta$. Sensor electrode 19 is at the also substantially constant voltage of $V_{SEN} = V_{bias} - V_{sb} - V_{sc} + V_{noise}$. In voltage value, both $V_B$ and $V_{SEN}$ are approximately at 3.5 volts. Here $V_{sb}$ represents the sensor 16 voltage output signal component due to the scene background present in the image portion formed on sensor 16 which component changes relatively little in time periods sufficient for significant changes in $V_{sc}$, where $V_{sc}$ represents the sensor 16 voltage output signal portion due to changes in the scene image portion formed on the sensor. The remaining component, $V_{noise}$, represents the rms sensor noise contribution. However, all of these signals $V_{sb}$, $V_{sc}$ and $V_{noise}$, change relatively little in time in comparison with the changes in the clocking voltages used to operate the charge-coupled devices shown in FIG. 2A and so these voltages are treated as substantially constant in describing the operation of the device shown in FIG. 2A during a frame.

At $t_1$, sampling electrode 21 is at approximately zero volts although the sampling electrode voltage oscillates between ground or zero volts and a high value of voltage of approximately 10.0 volts. This oscillation occurs at the sensor 16 output signal sampling rate in a frame, N, as does the oscillation in the voltage $v_d$ on the input diode region 14a.

Next, at $t_1$, $v_C$ on combining electrode 22 is operated at a substantially constant value high enough to provide a potential well for charge being transferred by sampling electrode 21. In this high voltage state $v_C$ will be at approximately 25.0 volts which will be maintained till about the end of the frame at which time this voltage drops to zero volts. Thereby, the transfer is effected to the buried-channel charge-coupled device structure 10a of the charge packet in the storage well under electrode 22 which is the frame combined representation for the scene image portion sample taken in the frame. Thus, the dip in the waveform at the right-hand side of the voltage graph for $v_C$ represents approximately the time duration of one frame, a duration which is approximately 17 milliseconds for a frame rate, R, of 60 frames per second.

Finally, the voltage $v_{CCD}$ on electrode 10a' of the buried-channel charge-coupled device structure 10a oscillates between zero volts and a high voltage value of approximately 15 volts. At $t_1$, $v_{CCD}$ is at the high voltage value so that the minimum value point bulk material potential shown for this electrode in FIG. 2B is low.

At time $t_2$, $v_D$ has dropped to zero volts as shown in FIG. 3. Correspondingly, the potential profile for time $t_2$ in FIG. 2B shows that the potential under region 14a has increased substantially providing a quantity of charge, $Q_{F1}$, beneath barrier electrode 17 and a sensor electrode 19.

Thereafter, at $t_3$, $v_D$ has again risen to its high voltage value and that portion of charge quantity $Q_{F1}$ which can not be shielded from region 19a at $v_D$ by $v_B$ on barrier electrode 17 spills back into region 14a. This leaves a charge quantity, $Q_{F2}$, remaining under sensor electrode 19. Because of the polarity chosen for diode 16, any output voltage signal portion due to a scene image portion falling on diode 16 will be subtracted from $V_{bias}$ so that the maximum value of $Q_{F2}$ will occur when no electromagnetic radiation impinges on diode 16. Thus, the amount of reduction in charge quantity from the maximum possible value of $Q_{F2}$ is what represents the signal due to the scene image on sensor 16. This maximum value of $Q_{F2}$ charge should, by choosing $V_\delta$ properly, be just a bit more than that opposite charge developed by the maximum voltage value of the output signal component due to the scene image changes, as developed in sensor 16 by the brightest intensity scene. The final value of $Q_{F2}$ is reached during the time between a leading edge of a pulse in $v_D$ and the leading edge of a pulse in $v_S$.

The quantity of charge $Q_{F2}$, rather than the reduction from the maximum thereof, could itself represent the change in the scene image information by reversing the polarity of sensor diode 16 and adding $V_\delta$ to $V_{bias}$ on electrode 17 rather than subtracting it. Also, one could reverse the sense or polarity of the signal charge by having diode 18 represent the sensor diode with electrode 19 operated at a constant voltage $V_{bias} - V_\delta$ with diode 16 removed.

Note however, that by having the reduction from the maximum value of charge quantity $Q_{F2}$ represent the scene change signal, that an inherent "antiblooming" capability is provided in the device of FIG. 2A. That is, when a bright spot in the scene causes the signal from sensor diode 16 to increase greatly, that there is a maximum possible signal developed under electrode 19 which is just the signal represented by a reduction to zero of the charge under electrode 19.

At time $t_4$, the final charge quantity reached under storage well electrode 19, before the pulse occurring in $v_S$ after $t_3$ begins is transferred by this pulse beneath sampling electrode 21 to combining electrode 22, a charge quantity which is represented by a $Q_N'$. As just stated, this is accomplished by a pulse in $v_S$, i.e., by having $v_S$ rise to its high level. Thereafter, at $t_5$, $v_S$ has dropped back to zero volts and the charge quantity $Q_N'$ is stored under combining electrode 22. The prime in this symbol, $Q_N'$, is to indicate that the scene image portion is represented by a reduction in the charge that would have been stored under electrode 19, and thence under electrode 22, in the absence of any radiation on diode 16.

In summary, the sensor output signal sample representation formed under sensor electrode 19 and transferred to combining electrode 22 is the charge, $Q_N'$, remaining due to the voltage on sensor electrode 19 after a portion also due thereto, but which cannot be prevented from spilling by the voltage on barrier electrode 17, has spilled back into region 14a. That remaining charge in the output signal sample representation is expressed by the following equation:

$$Q_N' = C_{SEN}(V_{bias} - V_{sb} - V_{sc} + V_{noise}) - C_{SEN}(V_{bias} - V_\delta) = C_{SEN}(V_\delta - V_{sb} - V_{sc} + V_{noise})$$

In this equation, $C_{SEN}$ represents the capacitance associated with the sensor storage well electrode 19 and substrate 23. $V_\delta$ represents the maximum signal swing expected in $V_{sc}$ plus the desired portion of $V_{sb}$ which is desired to be cancelled out through adjusting the voltage on barrier electrode 17 and thus adjusting the amount of charge under electrode 19 which spills back into region 14a over the barrier established by $V_B$ on electrode 17.

The preceding steps taking place through time $t_5$ are repeated many times to transfer a number of charge quantities similar to $Q_N'$ to combining electrode 22. Each of these charge quantity packets $Q_{Nn}'$ represent samples taken of the sensor diode 16 output signal, related to the current scene image, during a frame. As each of these charge quantities $Q_{N1}'$, $Q_{N2}'$, $Q_{N3}'$, ..., are transferred underneath combining electrode 22, they combine with one another but in such a way that each image scene related signal term therein, $C_{SEN}(V_\delta - V_{sb} - V_{sc})$, combines with the others coherently, i.e., combine by direct summation, while each noise term therein, $C_{SEN} V_{noise}$ sum in quadrature, i.e., combine through root-sum-square combining. Thus the combined signal component from each charge quantity $Q_{N1}'$, $Q_{N2}'$, $Q_{N3}'$, ..., representing an output signal sample increase faster than do the combined noise components from each such charge quantity to thereby improve the signal-to-noise ratio.

As the number of samples N of the sensor output signal in a frame grows, the greater the improvement in the signal-to-noise ratio. However, there are limits to the number of output signal samples which can be taken to represent any one scene image portion sample. First, the frame rate or the number of image scene samples (not output signal samples within a frame) taken per second is usually determined by sensing system use requirements and quite often the desire is to have the system operate with an ordinary television system leading to a 60 frames per second frame rate as earlier indicated. This means that the output signal sampling can only go on in a particular frame for approximately 17 milliseconds. Thus, the number of output signal samples N in a frame has a maximum which is due to the time length of the frame and is approached by sampling all the time during one frame (which need not necessarily be done).

N is further limited by the desired maximum size for the area of the storage electrode wells in the charge-coupled devices used in the system of FIGS. 1 and 2A which, in turn, determines the amount of maximum possible charge storage. Also, in this connection, the dark content developed within these storage well electrodes due to thermal charge generation determines the maximum time in which charge can be accumulated within these storage wells without having a substantial component added thereto by thermal generation. Hence, the rate at which the maximum size storage electrode wells are filled by charge, which is related to the input signal limits the size of N. The rate of filling cited signal related charge limitations are imposed both by the size of the signal itself and the closeness of the cancellation of $V_{sb}$ by $V_\delta$. In practice, the maximum value for N is approximately 1000.

The sensor signal sample charge quantities $Q_{N1}'$, $Q_{N2}'$, $Q_{N3}'$, ..., combine to form a combined frame charge quantity, $Q_C'$, where again the prime is used to indicate that the scene image signal is represented by the amount of charge not present that would otherwise be present were there no radiation falling on sensor diode 16. The equation representing this combined frame charge quantity for a scene image portion sample in a single frame is as follows:

$$Q_C' = C_{SEN}[NV_\delta - NV_{sb} - NV_{sc} + (N)^{\frac{1}{2}} V_{noise}]$$

The signal-to-noise ratio improvement is of course due to the slower growth of the noise term in the above equation in combining N output signal samples in a frame with respect to the growth of the signal terms by a factor on the order of $$N/N^{\frac{1}{2}} = N^{\frac{1}{2}} = (1000)^{\frac{1}{2}} = 32.$$

An approximate analysis of the signal and noise factors to thereby provide a first order signal-to-noise ratio characterizing individual input structure surface-channel charge-coupled device systems of the kind shown in FIG. 2A can be made as follows. For sensor diode 16, the output signal component related to the scene image after background cancellation has a related charge quantity, $Q_s'$, induced under the sensor input storage well electrode for a sample to be taken in some frame that will be related to all of the terms but the noise term in the first equation given above, or $$Q_s' = C_{SEN}(V_\delta - V_{sb} - V_{sc}).$$

The noise generated in sensor diode 16 will be taken here as being essentially shot noise and it is known from noise theory for diodes that the power of this noise in charge terms can be represented by $$Q_n^2 = k_1 \Delta B$$

where $\Delta B$ represents the bandwidth limit of the noise accepted from the output signal of sensor 16, and where $k_1$ is a constant combining several other constants. From sampling theory, the bandwidth $\Delta B$ is known to be equal to half the sampling frequency used to sample the output signal of sensor 16 in the system described above. Also, indicated above, the sampling frequency of the sensor output signal equals the sensor sampling rate in a frame, N, times the frame rate, R. Thus, the preceding equation can be rewritten as $$Q_n^2 = k_2 NR,$$

where again the constant $k_2$ combines other constants involved into a single constant.

The remainder of the noise involved in a particular sample transmitted to combining electrode 22 is that due to the sampling and transferring system preceding electrode 22, i.e., the noise developed in the individual input structure surface-channel charge-coupled device serving as the initial signal processor. This noise is due to the effective MOS transistor channel resistance occurring between the combining electrode 22 and sensor electrode 19. However, this noise is effectively bandlimited by the sensor capacitance $C_{SEN}$ which acts along with the effective channel resistance to provide a low pass filter for the channel resistance noise. Hence, the input charge-coupled device noise power, in charge terms, $Q_{ccd}^2$, can be written as a constant or $$Q_{ccd}^2 = k_3.$$

Thus, the total noise power in charge terms developed for each sample, $Q_{n\text{-}tot}^2$, which corresponds to the noise term in the first equation given above, $C_{SEN} V_{noise}$, can be written as the sum of the two immediately preceding equations. This results in $$Q_{n\text{-}tot}^2 = k_2 NR + k_3.$$

The signal-to-noise ratio for any particular sample in a frame can then be formed by taking the ratio of the signal power to the total noise power. This, from the foregoing, is $$\text{Sig/Noise}\Big|_{\substack{\text{one}\\\text{sample}}} = \frac{Q_s^2}{Q_{n\text{-}tot}^2} = \frac{Q_s^2}{k_2 NR + K_3} = \frac{Q_s}{(k_2 NR + k_3)^{\frac{1}{2}}}.$$

To find the corresponding signal-to-noise ratio for an entire frame, after the combining of N output signal samples under combining electrode 22, the signal-to-noise ratio must be found with the signal and noise elements combined under combining electrode 22 in the manner indicated above. That is, the signal components add coherently while the noise components add incoherently or in quadrature. Therefore, $$\text{Sig/Noise}\Big|_{\substack{N\\\text{samples}}} = \frac{(NQ_s)^2}{[(N)^{\frac{1}{2}} Q_{n\text{-}tot}]^2} = \frac{N^{\frac{1}{2}} Q_s}{Q_{n\text{-}tot}} = \frac{Q_s}{Q_{n\text{-}tot}/N^{\frac{1}{2}}}.$$

Substituting in the value of the total noise power from the equation therefor above yields the following:

$$\text{Sig/Noise}\Big|_{\substack{N\\\text{samples}}} = \frac{Q_s}{(k_2 NR + k_3)^{\frac{1}{2}}/N^{\frac{1}{2}}} = \frac{Q_s}{(k_2 R + \frac{k_3}{N})^{\frac{1}{2}}}.$$

Thus, as can be seen from this last equation, increasing N can reduce the input charge-coupled device generated noise to any degree desired by increasing N sufficiently. On the other hand, the detector generated noise for any particular frame rate R cannot be reduced by increasing the output signal sampling and, hence, has an irreducible minimum given the desire to keep the frame rate relatively low both to meet television system requirements and to keep the system bandwidth, i.e., the scene image sampling rate divided by two, relatively small to eliminate high frequency noise in the image scene.

The frame rate R is desired to be kept relatively low, in this latter instance, because the image scene changes typically do not have a frequency content of more than several hertz. This means that the sampling rate of the image scene which is determined by the frame rate should not be more than twice the scene change frequencies of significance if the bandwidth of the sample signals is to be limited to approximately that which is required to just encompass the scene change frequencies. This is of course a result of the sampling theory which indicates the bandwidth of a sampled signal will be approximately half of the sampling rate. By so having the sampling rate such that the bandwidth of the sample signals does not much exceed that of the scene change frequencies of interest, the noise components due to frequencies higher than significant scene change frequencies is excluded from being passed through the sensing system. Thus, by having the staring time in each scene change sample, i.e., the reciprocal of the frame rate R, relatively long, much of the higher frequency noise in the sensing system is eliminated to thereby improve the system signal-to-noise ratio.

The minimum frame rate R possible to maintain proper operation in the individual input structure surface-channel charge-coupled device is limited only by dark current, i.e., thermal change generation, considerations. With the choice of R and the choosing of a particular kind of photosensor, the values for the areas under the storage well electrodes and a value for N can be chosen limited by the area to be available on the monolithic integrated circuit chip. The input diode region 14a, the barrier and sampling electrodes, and the transfer electrode portion of electrode 10a' can be made as small as is physically possible. The sensor electrode 19 must be sufficiently large to permit an adequate sample size charge packet but not too large to lead to charge packets so large as to require excessively large area for electrode 10a'. The combining well electrode and the remainder of electrode 10a' must be large enough to accommodate the frame combined representation charge packet which depends in part on the amount of scene background elimination achieved.

A more detailed analysis of the individual input structure surface-channel charge-coupled device of FIG. 2A, an analysis where the principal addition is the taking into consideration of the 1/f noise of the sensor diode 16, yields the following noise figure, NF, for this input system:

$$NF = 1 + \frac{kTI_D}{3NRC_{SEN} q(\frac{kT}{q})^2 + C_{SEN} I_D \gamma_D \ln \frac{NR}{2}}$$

where the following symbol definitions hold:
 $k \triangleq$ Boltzmann's constant
 $T \triangleq$ absolute temperature
 $I_D \triangleq$ sensor diode current
 $N \triangleq$ sensor diode output signal sampling rate
 $R \triangleq$ frame rate
 $C_{SEN} \triangleq$ sensor input storage well electrode associated capacitance
 $\gamma_D \triangleq$ 1/f noise figure of merit for the sensor diode A typical noise figure assuming that $NR = 100 KHZ$ and that $C_{SEN} = 2.25 \times 10^{-14}$ farads would be approximately 1.5.

A better measure of the sensor and input system performance is found by use of the noise equivalent temperature for the system, NE$\Delta$T, which is given as $$NE\Delta T = \frac{[N\frac{kT}{C_{SEN}} + RN^2\frac{3q}{I_D}(\frac{kT}{q})^2 + \gamma_D \ln \frac{NR}{2}]^{\frac{1}{2}}}{.0356N(\frac{kT}{q})\ln(\frac{I_D}{I_S} + 1)}$$

where $I_S$ is the reverse saturation current for the sensor diode. Using the values given previously, one obtains the result $NE\Delta T = 0.002°$ C. for the sensor receiving radiation at a wavelength of 4.2 μm and $NE\Delta T = 0.002°$ C. for the sensor receiving radiation at a wavelength of 5.0 μm.

Returning to FIGS. 2B and 3, at time $t_6$, these figures show the situation after the N samples have been taken of the sensor diode 16 output signal and combined under combining input storage well electrode 22 to form $Q_C'$. These combined samples $Q_C'$ form the frame combined representation of the sample of the image scene portion occurring on sensor 16 in the frame currently being discussed. Thereafter, at $t_7$, charge quantity $Q_C'$ is transferred to beneath electrode 10a' of the buried-channel charge-coupled device structure 10a for transfer by this device and the buried-channel charge-coupled device 10f during the immediately subsequent frame in which new samples are being taken of the sensor diode 16 output signal (and during any time remaining in the present frame depending on the defined end thereof).

Before this transfer of $Q_C'$ from combining electrode 22 to buried-channel charge-coupled device structure 10a under the electrode 10a' occurs, electrode 10a' is used to provide a barrier between combining well electrode 22 and buried-channel charge-coupled device structure 10a. This is accomplished through having electrode 10a' extend beyond the buried region 15 toward combining electrode 22 so that this extended portion of electrode 10a', in part, serves as a surface-channel charge-coupled device electrode. With this structure, a potential barrier is maintained between combining electrode 22 and the buried-channel charge-coupled device structure 10a during operations of this buried-channel charge-coupled device not related to the individual input structure containing electrode 22. This occurs while device 10a is transferring frame combined representations from other sensors past the location of sensor diode 16 and its associated individual input structure surface-channel charge-coupled device.

For a transfer from electrode 22, then, the value of the voltage on combining electrode 22, $v_C$, is dropped to ground, or zero volts, and the transfer of the charge quantity $Q_C'$ can be accomplished if there is a sufficient voltage provided on electrode 10a'. Electrode 10a' is to be operated at a maximum voltage value of approximately 25.0 volts. In this manner, a transfer electrode is not required between combining electrode 22 and electrode 10a' for permitting the transfer of charge quantity $Q_C'$ to electrode 10a' without the need for halting or interrupting the operation of buried-channel charge-coupled device structure 10a in transferring frame combined representations from various sensors. This eliminating of the transfer gate helps reduce the area of the individual input structure surface-channel charge-coupled device taken in the major surface of substrate 23 below the electrodes in FIG. 2A. Of course, this reduction in area permits denser packing of the FIG. 1 structures and so of the sensor array associated therewith. Further, an extra clock phase need not be provided for operation of a transfer gate.

On the other hand, if the voltage maximum value on electrode 10a' is desired to be approximately equal to the maximum voltage values occurring on the other clocked electrodes in the charge-coupled devices of FIGS. 1 and 2A, a transfer gate may be used. Such a transfer gate is shown in dotted lines in FIG. 2A and designated 23. This transfer gate would be operated by a voltage source providing a voltage value on this gate designated by $v_T$. Also, buried region 15 would be somewhat reduced in size to be adjacent to transfer electrode 23 rather than underneath it. p A further alternative, if one is willing to stop the operation of the buried-channel charge-coupled device structure 10a for each transfer thereto, is to use electrode 10a' as the combining electrode. Thus, the surface area required could be reduced even further from that required for the individual input structure surface-channel charge-coupled device shown in FIG. 2A by eliminating combining electrode 22, as well as eliminating transfer electrode 23. After the scene image sample is taken, the buried-channel charge-coupled device structure 10a would again be operated to transfer the scene image sample so taken as well as those taken from other sensors.

Returning now to FIG. 2A, background diode sensor 18, when used, is shown connected to barrier electrode 17. Incident radiation, 24, is shown falling on this photodetector. However, this incident radiation differs from the incident radiation 20 falling on sensor diode 16 even though both radiations emanate from the same scene being viewed. In the first instance, radiation 20 is focused into an image falling on sensor diode 16. In the second instance, contrary to the situation in the first instance, radiation 24, from the same scene as radiation 20, is caused to impinge on background diode 18 without being focused, i.e., being passed through a non-focusing lens or some other device averaging the received radiation from the scene and thence transmitted to background sensor 18. As a result the output signal of diode 18 is a measure of the scene image average, rather than details of a portion thereof, and so provides a reference for subtracting the background from the output signal samples taken from sensing diode 16. In this manner of adjusting the voltage on barrier electrode 17 in response to scene image background changes, the background subtraction desired in the samples taken from the sensor diode 16 output signal can be automatically accomplished with diode 18 operated at $V_{bias} - V_{sc-max}$. Essentially only scene image change signal and noise components are sampled and transmitted to combining electrode 22 despite a slowly changing scene image background. Hence, the individual input structure surface-channel charge-coupled device is self-calibrating with respect to these background signal components and is thus independent of background temperature if diodes 16 and 18 are reasonably well matched. To be certain of this, these diodes should be fabricated in the same batch so they closely match and are free of batch-to-batch variations.

Since the device of FIG. 1 contemplates a large number of input systems of the kind shown in FIG. 2A being provided in a single structure, each of these input charge-coupled device structures will be self-calibrating if constructed in the manner of the structure of FIG. 2A. However, a separate background sensor diode 18 is not needed for each of these input structures, but rather, a single or a group of a few background sensor diodes can be used for the entire structure. This requires having the barrier electrode in each of the individual input structure surface-channel charge-coupled devices connected to the single, or if used, the group of background diodes. This will actually improve the performance of the system as the additional capacitance thereby connected to the background sensor will slow its response to any changes detected by it to thereby provide a relatively steady reference responding only to slow changes. Slow but definite trend changes will be sensed by the background diode and the reference voltage provided by it will change accordingly. Thus, the term $V_\delta - V_{sb}$ will be close to or at zero in the first equation given above. Using several diodes in the background sensor will tend to average out any variances in the diodes taken from a batch fabricated together.

In summary for FIG. 3, the pulse rate of $v_D$ is, as indicated above, equal to the frame rate times the sample rate of the diode sensor 16 output signal, i.e., NR. This is also true for $v_S$ which must sample in conjunction with the filling and spilling of the barrier and sensor electrode storage wells accomplished through the pulsing of $v_D$. On the other hand, $v_C$ operates at the frame rate R since it pulses only to once per frame to transmit the frame combined representation charge packet to buried-channel charge-coupled device 10a. However, charge-coupled device structure 10a is operated to transmit the frame combined representations from many individual input structure surface-channel charge-coupled devices through to the collecting buried-channel charge-coupled device structure 10f and thence to the receiving means on or off the device structure of FIG. 1. The buried-channel charge-coupled device structures may be two-phase, three-phase, or four-phase clock operated structures and hence only a minimum pulse rate can be given for $v_{CCD}$ for the structure of FIGS. 1 and 2A. That rate is equal to the frame rate R times the number of individual input structure surface-channel charge-coupled devices used in the device of FIG. 1 (which, of course, is equal to the number of sensing diodes used with the structure of FIG. 1).

Rather than operating with a photovoltaic sensor as shown in FIG. 2A, the individual input structure surface-channel charge-coupled device can be operated with a photoconductive sensor. This involves using a reset circuit to charge the sensor input storage well initially and then having the current from the photoconductive sensor drive the storage well capacitance associated with the sensor input storage well electrode and the other associated capacitances such as the diode capacitance. This can be accomplished by using a photoresistor as the photoconductive sensor or can be accomplished by using a diode as the photoconductive sensor. The latter situation is shown in FIG. 4.

Figure 4:
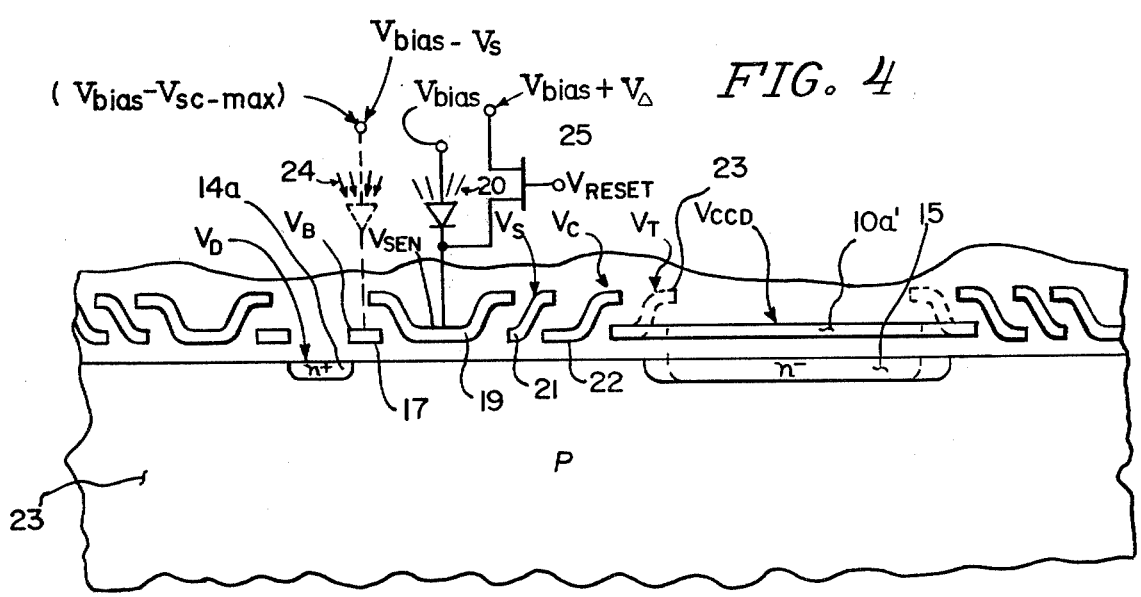
FIG. 4 shows a diagrammatic cross section view of an alternative implementation of the present invention.

In FIG. 4, all of the charge-coupled device electrodes, the substrate, the input diode region and the buried-channel charge-coupled device region have retained the same numeral designations and the same voltage designations as were used in FIG. 2A. The only addition is a metal-oxide-semiconductor (MOS) transistor, 25, which would be fabricated in and on substrate 23 in the usual manner for fabricating such transistors, using an extension of the oxide region shown below the electrodes 17, 19, 21 and 22 in FIG. 4 as the gate oxide for the transistor.

The timing diagrams in FIG. 3 all remain just as shown in connection with the operating of the structure of FIG. 2A for purposes of operating the structure of FIG. 4. However, there is an addition of one further timing diagram for the voltage, $v_{RESET}$, used to operate the gate of transistor 25. Operating the gate of transistor 25 with $v_{RESET}$ leads to cycling sensor electrode 19 between near zero volts and $V_{bias} + V_\Delta$ where $V_\Delta$ represents the desired reverse voltage on sensor diode 16. The currents through diode 16 reduce this reverse bias in flowing into the total input capacitance occurring at the diode cathode. This total capacitance, $C_{TOT}$ comprises the storage well capacitance $C_{SEN}$ associated with sensor electrode 19 plus the capacitance of diode 16 and the capacitance associated with the source diffusion of transistor 25.

Thus, for the structure of FIG. 4, the charge quantity $Q_N'$ associated with the sample taken from the output signal of the sensor diode 16, operated in the photoconductive mode, can be written as:

$$Q_N = C_{SEN}[V_{bias} + V_\Delta - \frac{(I_{sb} + I_{sc})\tau}{C_{TOT}} + V_{noise}] -$$
$$C_{SEN}(V_{bias} - V_\delta) = C_{SEN}[V_\delta + V_\Delta - \frac{(I_{sb} + I_{sc})\tau}{C_{TOT}} + V_{noise}]$$

where $\tau$ represents the integration time of the current flow into the total capacitance associated with the cathode of the sensor diode 16. This time duration $\tau$ is the portion of the cycle for each sample of the sensor 16 output signal when $v_{RESET}$ is at ground or zero volts. $I_{sb}$ and $I_{sc}$ are the photocurrents related to the scene image background and scene change components, respectively. Diode 18 is assumed to not be used for purposes of the above equation. Of course, in practice, diode 18 can be used as either a background sensor or a photoconductive scene image sensor in conjunction with a MOS transistor.

Again, the signal components add coherently while the noise components add incoherently, or in quadrature, with the result that the charge packet provided as the frame combined representation under combining electrode 22 after N samples have been taken is:

$$Q_C = C_{SEN}[NV_\delta + NV_\Delta - \frac{N(I_{sb} + I_{sc})\tau}{C_{TOT}} + (N)^{\frac{1}{2}} V_{noise}].$$

Use of a photoresistor rather than a diode provides essentially the same results, with the necessary biasing differences in operating photoresistors as opposed to photodiodes being the only differences appearing in the above equations.

Figure 5A:
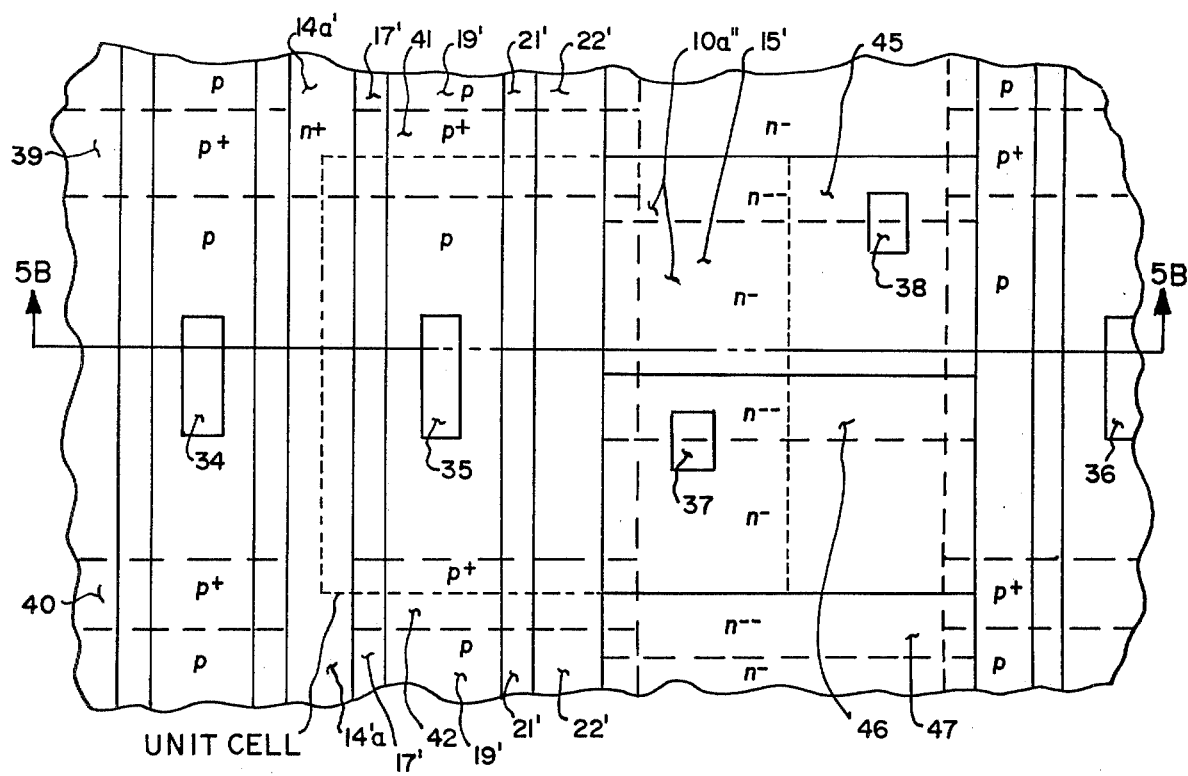
FIGS. 5A and 5B show partial representation of plan and cross section views of the present invention.
Figure 5B:
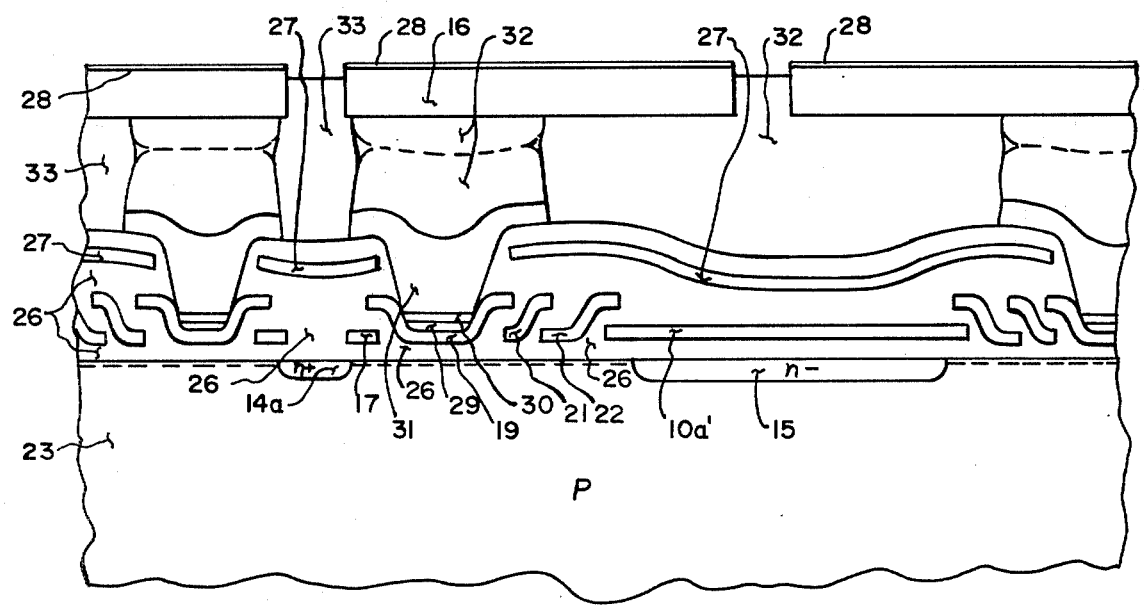

FIGS. 5A and 5B provide additional information concerning FIG. 2A and the associated structural portion of FIG. 1. FIG. 5B shows added structural details of the sensor array when shown, as typically provided, along with the charge-coupled device structures of FIG. 2A. The structural portions that are common to FIGS. 2A and 5B have been designated the same numerals in each. In the typical construction shown in FIG. 5B, the silicon dioxide portions, 26, on silicon substrate 23 serve to both separate the various storage well electrodes of the surface-channel and buried-channel charge-coupled devices from substrate 23 and to provide a protective cover thereover. These storage well electrodes are all of phosphorus-doped polysilicon. The portions of oxide 26 separating both the surface-channel and buried-channel charge-coupled device electrodes from substrate 23 are approximately 1000 to 1100 Å thick.

A dashed line just below the surface of substrate 23 represents the result of an implantation step made to adjust the threshold voltage (which concerns inversion of substrate 23 at the substrate major surface such as required to operate an enhancement mode MOS transistor fabricated in and on substrate 23). This threshold adjust implantation step involves implanting boron ions with a dose of 6 to $8 \times 10^{11}$ ions/cm$^2$ at 80 kev.

Region 14a for the input diode is formed by doping with phosphorus atoms in a concentration of $10^{18}$ atoms/cm$^3$ with the pn junction therearound having a maximum depth of about 1.6 μm. Buried-channel region 15 is also formed of phosphorus atoms but is of n-type conductivity having a concentration of only $10^{16}$ atoms/cm$^3$ with a maximum junction depth of about 1 μm. This lower doping is in accord with region 15 being a storage region for a buried-channel charge-coupled device. Substrate 23 is boron doped silicon with a 5 to 7ω-cm resistivity.

A metallic shield, 27 is shown in FIG. 5B provided in oxide 26 over several of the electrodes in the charge-coupled devices. This metal shield is typically grounded and is used to reduce the capacitance between the clocked storage well electrodes of the surface-channel and buried-channel charge-coupled devices, on the one hand, and the sensing diodes such as sensor diode 16 on the other hand.

The sensing diodes, including sensor diode 16, are all constructed of (Hg,Cd)Te which has been doped to provide a pn junction therein. This junction is marked by line 28 in FIG. 5B. On the top surface of these sensing diodes, including diode 16, is a transparent electrode for making electrical contact to the diode and which permits passage of infrared radiation therethrough to then impinge on the photodiode.

On the other side of these sensing photodiodes, there is a metallization system which is used in mounting the photodiodes to the structure below while at the same time providing electrical contact to the surface-channel charge-coupled device sensor storage well electrodes, including sensor electrode 19. The metal system shown between sensor electrode 19 and sensor diode 16, beginning at the doped polysilicon of sensor 19, first has a titanium layer, 29. Thereupon, another layer, 30, is provided which is of palladium. A substantial gold layer, 31, is then provided over the palladium. Finally, indium is provided on both the sensor diode 16 and on the gold bump 31. In mounting sensor diode 16, the two indium surfaces are brought together to form a combined indium layer, 32, in the metal system shown in FIG. 5B. Dashed lines are shown approximately between the two initial indium portions to indicate where they have been joined. Thereafter, an epoxy filler, 33, is used to further support the sensor diodes and to protect the surface structure below.

Turning to FIG. 5A, there is shown a diagrammatic plan view of the device of FIG. 2A assuming the buried-channel charge-coupled device present in this latter figure is a two-phase operated device. Thus, the plan view of FIG. 5A is also a plan view of the device of FIG. 5B with the photodiodes there removed as well as the epoxy, the photodiode metal system mountings, the capacitive shield and the overlying oxide.

FIG. 5A, which is aligned with the corresponding surface-channel and buried-channel charge-coupled device storage well electrodes present in FIG. 5B, is shown in diagrammatic form in that only the effective areas of these electrodes are marked out and these are shown by solid lines. Thus, no overlaps of the electrodes are shown in FIG. 5A despite there being such overlaps in actuality as shown in FIG. 5B. No dashed lines are used to indicate portions hidden due to such overlaps in FIG. 5A although a complete plan view corresponding to FIG. 5B would require such a showing. The lines of long dashes in FIG. 5A represent doped region limits in the substrate 23. Diagram portions of FIG. 5A which correspond to structural portions of FIG. 5B have retained the same designation as in FIG. 5B, but with a prime symbol added thereto.

Region 14a' is not seen to be set off with dashed lines because the two effective barrier electrode regions provided on either side thereof are shown by solid lines just where the dashed lines for region 14a' would be. The effective barrier electrode region on the right-hand side of region 14a' is designated 17' in correspondence with barrier electrode 17 in FIG. 5b. Moving to the right in FIG. 5A, there is the effective sensor electrode region 19', the effective sampling electrode region 21', the effective combining electrode region 22', and finally the effective buried-channel charge-coupled electrode region 10a''. Underneath the region 10a'' there is shown by dashed lines the buried channel 15' corresponding to the buried channel region 15 in FIG. 5B.

Further shown in FIG. 5A are three electrical interconnection openings for the sensor diodes, including sensor diode 16, these openings being designated 34, 35, and 36. Openings are also shown for electrically interconnecting the two-phase clocks to the buried-channel charge-coupled device structure 10a, these openings being designated 37 and 38.

There are several additional dashed line marked regions which represent the geometrical limits of doped regions provided in substrate 23. The channel stop regions which separate individual input structure surface-channel charge-coupled devices from one another, 39(9a), 40(9a), 41(9a), 42(9a), 43(9b), and 44(9b), are provided by implanting boron. The designations in parentheses behind the channel stop designations just given are the comparable designations in FIG. 1. In the implantation step, the dose of boron ions is $10^{13}$ ions/cm$^2$ at 80 kev to form p+ type conductivity regions. Since the buried-channel charge-coupled device structure 10a of FIG. 1 is chosen to be a two-phase operated structure, barrier regions must be provided in substrate 23 in fabricating this structure. These regions, 45(12a), 46(12a), and 47(12a), are n$^{--}$-type conductivity regions doped with phosphorus in substrate 23, again with the FIG. 1 designations given in parentheses. These regions have a concentration of $5 \times 10^{15}$ atoms/cm$^3$. In accord with what was earlier indicated, region 15' is a storage region of n$^-$-type conductivity.

To indicate the approximate geometric dimensions of the structural portions shown in FIG. 5A, first the horizontal width of region 14a' is approximately 4 μm. The horizontal dimension of effective barrier region 17' is 2 μm. The horizontal dimension of region 19' is 6 μm while that of region 21' and 22' are 2 μm and 4 μm, respectively. The horizontal dimension of region 10a'' is 22 μm while the horizontal dimension of region 15' is 18 μm.

On the other hand, the vertical dimension of region 10a'' is 13 μm with barrier region 45 being 4 μm in the vertical dimension. The vertical dimension of the channel stops is 4 μm.

Given these dimensions for FIG. 5A, the size can be determined of a unit cell repeated throughout FIG. 1 containing an individual input structure for a single sensor input and an allocated portion of the combined frame representation transfer structure. This individual input structure contains the surface-channel charge-coupled device structure shown in FIG. 5A within the rectangle of short dashes plus a proportionate half of region 14a', the other proportionate half of region 14a' going to the unit cell which would lie to the left of the presently considered unit cell. Also, only a proportionate half is taken of the buried-channel charge-coupled device transfer structure 10a. So defined, the unit cell in FIG. 5A has a horizontal dimension of 27 μm and a vertical dimension of 26 μm, or about 1 mil square. Thus a very compact unit cell is provided by the structures shown in FIG. 5B.

Standard monolithic integrated circuit processing steps can be used for forming the surface-channel and buried-channel charge-coupled device structures shown in FIG. 5B. Also, standard steps can be used for forming the (Hg,Cd)Te photodiodes if these are used as the input sensors. Use of other kinds of input sensors are contemplated but no special processing steps should be needed in forming these structures for use with the structure of FIG. 5B. If the arrangement of FIG. 4 is to be used, a complete structure will more or less follow what is shown for the structure of FIG. 5B but with provision made for forming a MOS transistor. Thus, a somewhat larger cell size is required to accommodate the arrangement of FIG. 4.

The embodiments of the inventions in which an exclusive property or right is claimed are defined as follows:

1. A sensor signal processor device having therein a charge-transfer device and having an input means to said charge-transfer device to accomodate, as an input source, a first sensor having two sensor output terminals, said first sensor being capable of providing a first sensor output signal, representative of that which is to be sensed, between said two first sensor output terminals, said signal processor device comprising:

a semiconductor material body of a first conductivity type except in selected regions thereof including first and second selected regions, said semiconductor material body having a first major surface, said first selected region in said semiconductor material body being of a second conductivity type and intersecting said first major surface;

a first selected region contact means in ohmic contact with said first selected region and adapted for electrical connection to a first voltage source;

an initial plurality of collector charge-transfer device storage well electrodes, including a first collector charge-transfer device storage well electrode, with each collector charge-transfer storage device well electrode being immediately adjacent to at least one other one, but being immediately adjacent to a maximum of two other ones, and each collector charge-transfer device storage well electrode being spaced apart from said first major surface by a first electrical insulating layer; and an initial plurality of input charge-transfer device storage well electrodes including first, second, and third input charge-transfer device storage well electrodes which are provided in that order between said first selected region and said first collector charge-transfer device storage well electrode, said first input charge-transfer device storage well electrode being immediately adjacent to said first selected region, said first, second, and third input charge-transfer device storage well electrodes being spaced apart from said first major surface by a second electrical insulating layer with a selected one of said first and second input charge-transfer device storage well electrodes being adapted for electrical connection to a selected one of said two first sensor output terminals, and with that one of said first and second input charge-transfer device storage well electrodes not so connected being instead electrically connected to a first connection means which is adapted for electrical connection also to a second voltage source, and with said third storage well electrode being adapted for electrical connection to a third voltage source.

2. The apparatus of claim 1 wherein said first collector charge-transfer device storage well electrode is immediately adjacent to said third input charge-transfer device storage well electrode.

3. The apparatus of claim 1 wherein said initial plurality of input charge-transfer device storage well electrodes includes a fourth input charge-transfer device storage well electrode which is provided immediately adjacent to said third input charge-transfer device storage well electrode and between said third input charge-transfer device storage well electrode and said first collector charge-transfer device storage well electrode.

4. The apparatus of claim 1 wherein said first sensor is provided as a portion of said signal processor device with said selected one of said first and second input charge-transfer device storage well electrodes being electrically connected to said selected one of said two sensor output terminals.

5. The apparatus of claim 1 wherein said first connection means is a direct electrical interconnection.

6. The apparatus of claim 1 wherein said first connection means comprises a background sensor which is capable of sensing at least a portion of that which is sensed by said first sensor.

7. The apparatus of claim 2 wherein said initial plurality of input charge-transfer device storage well electrodes, as provided, and said first selected region comprise a surface-channel charge-coupled device structure with a diode input, and wherein said initial plurality of collector charge-transfer device storage well electrodes as provided comprise a buried-channel charge-coupled device structure with said second selected region being of said second conductivity type and intersecting said first major surface opposite said initial plurality of collector charge-transfer device storage well electrodes across said first insulating layer.

8. The apparatus of claim 3 wherein said initial plurality of input charge-transfer device storage well electrodes includes a fifth input storage well electrode which is provided between, and immediately adjacent to each of, said fourth input charge-transfer device storage well electrode and said first collector charge-transfer device storage well electrode.

9. The apparatus of claim 3 wherein said initial plurality of input charge-transfer device storage well electrodes, as provided, and said first selected region comprise a surface-channel charge-coupled device structure with a diode input, and wherein said initial plurality of collector charge-transfer device storage well electrodes, as provided, comprise a buried-channel charge-coupled device structure with said second selected region being of said second conductivity type and intersecting said first major surface opposite said initial plurality of collector charge-transfer device storage well electrodes across said first insulating layer, but where a portion of said first collector charge-transfer device storage well electrode extends substantially beyond where said second selected region is opposite and there extends toward said fourth input charge-transfer device storage well electrode, with said fourth input charge-transfer device storage well electrode and said first collector charge-transfer storage well electrode being immediately adjacent to one another.

10. The apparatus of claim 4 wherein said selected one of said two sensor output terminals is substantially in rigid contact with said selected one of said first and second input charge-transfer device storage well electrodes such that said selected one of said first and second input charge-transfer device storage well electrodes, at least in part, serves to support said first sensor.

11. The apparatus of claim 6 wherein said background sensor is provided as a portion of said signal processor device.

12. The apparatus of claim 7 wherein said first sensor is provided as a portion of said signal processor device with said selected one of said first and second input charge-transfer device storage well electrodes being electrically connected to said selected one of said two sensor output terminals.

13. The apparatus of claim 7 wherein said first connection means is a direct electrical interconnection.

14. The apparatus of claim 7 wherein said first connection means comprises a background sensor which is capable of sensing at least a portion of that which is sensed by said first sensor.

15. The apparatus of claim 7 wherein there is at least one further plurality of input charge-transfer device storage well electrodes and at least one further sensor, a corresponding second sensor, arranged relatively as are said initial plurality of input charge-transfer device storage well electrodes and said first sensor, where said further plurality of input charge-transfer device storage well electrodes has contained therein an input charge-transfer device storage well electrode again immediately adjacent to said first selected region, but has another input charge-transfer device storage well electrode contained therein, rather than being immediately adjacent to said first charge-transfer device storage well electrode, being immediately adjacent to another collector charge-transfer device storage well electrode contained in a selected one of (i) said initial plurality of collector charge-transfer device storage well electrodes, and (ii) a second plurality of collector charge-transfer device storage well electrodes arranged in parallel, at least in part, with said initial plurality of collector charge-transfer sensor storage well electrodes.

16. The apparatus of claim 7 wherein there is at least one further plurality of input charge-transfer device storage well electrodes and at least one further sensor, a corresponding second sensor, arranged relatively as are said initial plurality of input charge-transfer device storage well electrodes and said first sensor, where said further plurality of input charge-transfer device storage well electrodes has contained therein an input charge-transfer device storage well electrode again immediately adjacent to said first collector charge-transfer device storage electrode, but has another input charge-transfer device storage well electrode contained therein immediately adjacent to a third selected region in said semiconductor material body of a second conductivity type intersecting said first major surface, where said third selected region is arranged in parallel, at least in part, with said first selected region.

17. The apparatus of claim 8 wherein said initial plurality of input charge-transfer device storage well electrodes, as provided, and said first selected region comprise a surface-channel charge-coupled device structure with a diode input, and wherein said initial plurality of collector charge-transfer device storage well electrodes, as provided, comprise a buried-channel charge-coupled device structure with said second selected region being of said second conductivity type and intersecting said first major surface opposite said initial plurality of collector charge-transfer device storage well electrodes across said first insulating layer.

18. The apparatus of claim 9 wherein said first sensor is provided as a portion of said signal processor device with said selected one of said first and second input charge-transfer device storage well electrodes being electrically connected to said selected one of said two sensor output terminals.

19. The apparatus of claim 9 wherein said first connection means is a direct electrical interconnection.

20. The apparatus of claim 9 wherein said first connection means comprises a background sensor which is capable of sensing at least a portion of that which is sensed by said first sensor.

21. The apparatus of claim 9 wherein there is at least one further plurality of input charge-transfer device storage well electrodes and at least one further sensor, a corresponding second sensor, arranged relatively as are said initial plurality of input charge-transfer device storage well electrodes and said first sensor, where said further plurality of input charge-transfer device storage well electrodes has contained therein an input charge-transfer device storage well electrode again immediately adjacent to said first selected region, but has another input charge-transfer device storage well electrode contained therein, rather than being immediately adjacent to said first charge-transfer device storage well electrode, being immediately adjacent to another collector charge-transfer device storage well electrode contained in a selected one of (i) said initial plurality of collector charge-transfer device storage well electrodes, and (ii) a second plurality of collector charge-transfer device storage well electrodes arranged in parallel, at least in part, with said initial plurality of collector charge-transfer device storage well electrodes.

22. The apparatus of claim 9 wherein there is at least one further plurality of input charge-transfer device storage well electrodes and at least one further sensor, a corresponding second sensor, arranged relatively as are said initial plurality of input charge-transfer device storage well electrodes and said first sensor, where said further plurality of input charge-transfer device storage well electrodes has contained therein an input charge-transfer device storage well electrode again immediately adjacent to said first collector charge-transfer device storage electrode, but has another input charge-transfer device storage well electrode contained therein immediately adjacent to a third selected region in said semiconductor material body of a second conductivity type intersecting said first major surface, where said third selected region is arranged in parallel, at least in part, with said first selected region.

23. The apparatus of claim 10 wherein said first sensor is a semiconductor photodiode having an anode region and a cathode region with a different one of said two sensor output terminals connected to each of these regions.

24. The apparatus of claim 10 wherein said first sensor is a photoresistor.

25. The apparatus of claim 17 wherein said first sensor is provided as a portion of said signal processor device with said selected one of said first and second input charge-transfer device storage well electrodes being electrically connected to said selected one of said two sensor output terminals.

26. The apparatus of claim 17 wherein said first connection means is a direct electrical interconnection.

27. The apparatus of claim 17 wherein said first connection means comprises a background sensor which is capable of sensing at least a portion of that which is sensed by said first sensor.

28. The apparatus of claim 17 wherein there is at least one further plurality of input charge-transfer storage well electrodes and at least one further sensor, a corresponding second sensor, arranged relatively as are said initial plurality of input charge-transfer device storage well electrodes and said first sensor, where said further plurality of input charge-transfer device storage well electrodes has contained therein an input charge-transfer device storage well electrode again immediately adjacent to said first selected region, but has another input charge-transfer device storage well electrode contained therein, rather than being immediately adjacent to said first charge-transfer device storage well electrode, being immediately adjacent to another collector charge-transfer device storage well electrode contained in a selected one of (i) said initial plurality of collector charge-transfer device storage well electrodes, and (ii) a second plurality of collector charge-transfer device storage well electrodes arranged in parallel, at least in part, with said initial plurality of collector charge-transfer device storage well electrodes.

29. The apparatus of claim 17 wherein there is at least one further plurality of input charge-transfer device storage well electrodes and at least one further sensor, a corresponding second sensor, arranged relatively as are said initial plurality of input charge-transfer device storage well electrodes and said first sensor, where said further plurality of input charge-transfer device storage well electrodes has contained therein an input charge-transfer device storage well electrode again immediately adjacent to said first collector charge-transfer device storage electrode, but has another input charge-transfer device storage well electrode contained therein immediately adjacent to a third selected region in said semiconductor material body of a second conductivity type intersecting said first major surface, where said third selected region is arranged in parallel, at least in part, with said first selected region.

30. A method for processing sensor output signals such as that signal a first sensor is capable of providing between two first sensor output terminals thereof as a first sensor output signal, when sensing that which is to be sensed, said first sensor output signal representing both a (i) relatively constant portion over time, if any, and (ii) a relatively changeable portion over time of that which is to be sensed, this representation being provided by corresponding relatively constant and relatively changing amplitude portions in said first sensor output signal which amplitude portions, summed, equal said first sensor output signal, said method comprising:

sampling, N times, said first sensor output signal in a first frame time duration to form N first frame first sensor sample representations in such a manner that each of said N first frame first sensor sample representations represent said relatively changeable amplitude portion of said first sensor output signal, but also represent only a fraction of said relatively constant portion thereof, if any, where $N>2$;

storing each of said N first frame first sensor sample representations, directly after said forming thereof, in a first storage means which combines each of said N first frame first sensor sample representations into a single first sensor combined representation thus forming a first frame first sensor combined representation;

transferring said first frame first sensor combined representation by at least a portion of a transfer means from said first storage means to a receiver means; and repeating said sampling and said storing steps above a further number of times to sequentially form a plurality of first sensor combined representations, in said first storage means, including said first frame first sensor combined representation, and transferring sequentially each of said first sensor combined representations, including said first frame first sensor combined representation, by said transfer means from said first storage means to said receiver means.

31. The method of claim 30 wherein those said sampling and said storing steps leading to forming a $(k+1)$ frame first sensor combined representation among said plurality of first sensor combined representations, as aforesaid, occur, at least in part, during said transferring step for an immediately preceding k frame first sensor combined representation.

32. The method of claim 30 wherein there is simultaneous processing of further sensor output signals each of which a further sensor is capable of providing between two sensor output terminals thereof, in that manner said first sensor output signal is provided by said first sensor, and wherein said method further comprises forming sensor combined representations for each of these further sensor output signals in corresponding further storage means in that manner used in forming said first sensor combined representations in said first storage means, as aforesaid, and transferring these further sensor combined representations through portions of said transfer means from said corresponding further storage means to said receiver means.

33. The method of claim 30 wherein said sampling and storing of said first sensor output signal is performed in an input surface-channel charge-coupled device provided in and on a semiconductor material body of a first conductivity type except in selected regions thereof, including first and second selected regions, said semiconductor material body having a first major surface which said first selected region intersects, said first selected region being of a second conductivity type and separated from remaining portions of said semiconductor material body by a first semiconductor junction, there being a first selected region contact means in ohmic contact with said first selected region and adapted for electrical connection to a first voltage source, said input surface-channel charge-coupled device in addition to said first selected region further comprising an initial plurality of input charge-coupled device storage well electrodes including first, second, and third input charge-coupled device storage well electrodes which are provided in that order away from said first selected region with said first input charge-coupled device storage well electrode being immediately adjacent to said first selected region, and with a selected one of said first and second input charge-coupled device storage well electrodes being adapted for electrical connection to a selected one of said two first sensor output terminals with that one of said first and second input charge-coupled device storage well electrodes not so connected being instead electrically connected to a first connection means which is adapted for electrical connection also to a second voltage source, and with said third input charge-coupled device storage well electrode being adapted for electrical connection to a third voltage source, said sampling and storing comprising:

oscillating, at a sampling frequency, said first voltage source between a voltage value sufficient to reverse bias said first semiconductor junction and a voltage value sufficient to forward bias said first semiconductor junction; and oscillating said third voltage source at said sampling frequency, but delayed in phase from said oscillating of said first voltage source, between a voltage value sufficient to block transfers of electrical charge, and a voltage value sufficient to permit transfer of electrical charge, between said first and second input charge-coupled device storage well electrodes and said first storage means.

34. The method of claim 33 wherein said first sensor is provided as a portion of said input surface-channel charge-coupled device with said selected one of said first and second input charge-coupled device storage well electrodes being electrically connected to said selected one of said two first sensor output terminals.

35. The method of claim 33 wherein said first connection means is a direct electrical interconnection.

36. The apparatus of claim 33 wherein said first connection means comprises a background sensor which senses at least a portion of that which is sensed by said first sensor.

37. The method of claim 33 wherein said initial plurality of input charge-coupled device storage well electrodes includes a fourth input charge-coupled device storage well electrode which is provided immediately adjacent to said third input charge-coupled device storage well electrode in a direction away from said first selected region.

38. The method of claim 33 wherein said transferring is performed in a collector charge-coupled device having a storage means collector charge-coupled device storage well electrode therein, said storage means collector charge-coupled storage well electrode serving as par of said first storage means.

39. The method of claim 34 wherein said selected one of said two sensor output terminals is substantially in rigid contact with said selected one of said first and second input charge-coupled device storage well electrodes such that said selected one of said first and second input charge-coupled device storage well electrodes, at least in part, serves to support said first sensor.

40. The method of claim 35 wherein said second voltage source is set at a value sufficient to have each of said N first frame first sensor sample representations represent only a fraction of said relatively constant portion of said first sensor electrical output signal as aforesaid.

41. The method of claim 37 wherein said transferring of said first sensor combined representations is performed by a collector buried-channel charge-coupled device provided in and on said semiconductor material body and which has a first collector buried-channel charge-coupled device storage well electrode, said first collector buried-channel charge-coupled device storage well electrode being provided immediately adjacent to said fourth input charge-coupled device storage well electrode with said fourth input charge-coupled device storage well electrode serving as part of said first storage means, said method further comprising transferring a k frame first sensor combined representation, among said plurality of first sensor combined representations, during those said sampling and said storing steps leading to forming an immediately following (k+1) frame first sensor combined representation.

42. The method of claim 37 wherein said initial plurality of input charge-coupled device storage well electrodes includes a fifth input charge-coupled device storage well electrode which is provided immediately adjacent to said fourth input charge-coupled device storage well electrode in a direction away from said first selected region, and wherein said transferring of said first sensor combined representations is performed by a collector buried-channel charge-coupled device provided in and on said semiconductor material body and which has a first collector buried-channel charge-coupled device storage well electrode, said first collector buried-channel charge-coupled device storage well electrode being provided immediately adjacent to said fifth input charge-coupled device storage well electrode with said fourth input charge-coupled device storage well electrode serving as part of said first storage means, said method further comprising transferring a k frame first sensor combined representation, among said plurality of first sensor combined representations, during those said sampling and said storing steps leading to forming an immediately following (k+1) frame first sensor combined representation.

43. The method of claim 39 wherein said first sensor is a semiconductor photodiode having an anode region and a cathode region with a different one of said two first sensor output terminals connected to each of these regions.

44. The method of claim 39 wherein said first sensor is a photoresistor.

45. A method for processing sensor output signals such as that signal a first sensor is capable of providing between two first sensor output terminals thereof as a first sensor output signal, when sensing electromagnetic radiation impinging thereon in form of a portion of a substantially focussed image of a scene from which said radiation emanated, said first sensor output signal representing both a (i) relatively constant portion over time, if any, and (ii) a relatively changeable portion over time of said radiation, this representation being provided by corresponding relatively constant and relatively changing amplitude portions in said first sensor electrical output signal which amplitude portions, summed, equal said first sensor electrical output signal, said method comprising:

exposing said first sensor to said radiation from said scene to impinge thereon in form of substantially focussed first image portion which said first sensor senses to thereby form said first sensor output signal;

exposing a background sensor, operating as does said first sensor, to radiation also emanating from said scene to impinge thereon in a substantially unfocussed manner which said background sensor senses to form a background sensor output signal; and receiving both (i) an initial representation of said first sensor signal, and (ii) a representation of said background sensor signal forming a first background representation, in a first cancelling means which provides a modified representation of said first sensor signal through cancelling a selected part of that portion of said first sensor signal initial representation which represents said relatively constant amplitude portion of said first sensor output signal, said selected part being determined at least in part by said first background representation.

46. The method of claim 45 wherein there also occurs:

exposing a second sensor, operating as does said first sensor, to electromagnetic radiation also emanating from said scene to impinge thereon in form of a substantially focussed second image portion which said second sensor senses to form a second sensor output signal; and receiving both (i) an initial representation of said second sensor output signal, and (ii) a representation of said background sensor signal forming a second background representation, in a second cancelling means which provides modified representation of said second sensor signal through cancelling a selected part of that portion of said second sensor signal initial representation which represents that relatively constant amplitude portion of said second sensor output signal, said selected part being determined at least in part by said second background representation.

47. The method of claim 45 wherein said first sensor and said background sensor are each photodiodes formed in a common process and in a common batch.

48. The method of claim 45 wherein said first sensor is a photodiode and said background sensor is a plurality of photodiodes and where said first sensor photodiode and said background sensor plurality of photodiodes are all made in a common process and in a common batch.

49. The method of claim 45 wherein said first cancelling means is an input surface-channel charge-coupled device provided in and on a semiconductor material body of a first conductivity type except in selected regions thereof, including first and second selected regions, said second semiconductor material body having a first major surface which said first selected region intersects, said first selected region being of a second conductivity type and separated from remaining portions of said semiconductor material body by a first semiconductor junction, there being a first selected region contact means in ohmic contact with said first selected region and adapted for electrical connection to a first voltage source, said input surface-channel charge-coupled device in addition to said first selected region further comprising an initial plurality of input charge-coupled device storage well electrodes including first, second, and third input charge-coupled device storage well electrodes which are provided in that order away from said first selected region with said first input charge-coupled device storage well electrode being immediately adjacent to said first selected region, and with a selected one of said first and second input charge-coupled device storage well electrodes being adapted for electrical connection to a selected one of said first two sensor output terminals with that one of said first and second input charge-coupled device storage well electrodes not so connected being instead electrically connected to one of two output terminals provided on said background sensor, and with said third input charge-coupled device storage well electrode being adapted for electrical connection to a second voltage source, said receiving and cancelling comprising:

oscillating, at a sampling frequency, said first voltage source between a voltage value sufficient to reverse bias said first semiconductor junction and a voltage value sufficient to forward bias said first semiconductor junction; and oscillating said second voltage source at said sampling frequency, but delayed in phase from said oscillating of said first voltage source, between a value sufficient to block transfers of electrical charge, and a voltage value sufficient to permit transfer of electrical charge, between said first and second input charge-coupled device storage well electrodes and a first storage means.

50. The method of claim 46 wherein said first and second sensors and said background sensor are each photodiodes formed in a common process and in a common batch.

51. The method of claim 46 wherein said first and second sensors are each a photodiode and said background sensor is a plurality of photodiodes where said first and second sensor photodiodes and said background sensor plurality of photodiodes are all made in a common process and in a common batch.

52. The method of claim 49 wherein said first sensor is provided as a portion of said input surface-channel charge-coupled device with said selected one of said first and second input charge-coupled device storage well electrodes being electrically connected to said selected one of said two first sensor output terminals.

53. The method of claim 49 wherein said initial plurality of input charge-coupled device storage well electrodes includes a fourth input charge-coupled device storage well electrode which is provided immediately adjacent to said third input charge-coupled device storage well electrode in a direction away from said first selected region.

54. The method of claim 52 wherein said selected one of said two sensor output terminals is substantially in rigid contact with said selected one of said first and second input charge-coupled device-storage electrodes such that said selected one of said first and second input charge-coupled device storage well electrodes, at least in part, serves to support said first sensor.

55. The method of claim 53 wherein there is a collector buried-channel charge-coupled device provided in and on said conductor material body which has a first collector buried-channel charge-coupled device storage well electrode, said first collector buried-channel charge-coupled device storage well electrode being provided immediately adjacent to said fourth input charge-coupled device storage well electrode with said fourth input charge-coupled device storage well electrode serving as part of said first storage means.

56. The method of claim 53 wherein said initial plurality of input charge-coupled device storage well electrodes includes a fifth input charge-coupled device storage well electrode which is provided immediately adjacent to said fourth input charge-coupled device storage well electrode in a direction away from said first selected region, there being a collector buried-channel charge-coupled device provided in an on said semiconductor material which has a first collector buried-channel charge-coupled device storage well electrode, said first collector buried-channel charge-coupled device storage well electrode being provided immediately adjacent said fifth input charge-coupled device storage well electrode with said fourth input charge-coupled device storage well electrode serving as part of said first storage means.

57. The method of claim 54 wherein said first sensor and said background sensor are each semiconductor photodiodes each having an anode region and a cathode region, there being a different one of said two first sensor output terminals connected to each of these regions in said first sensor, said first sensor and said background sensor photodiodes being fabricated in a common process in a common batch.

58. The method of claim 54 wherein said first sensor and said background sensor are each a photoresistor.

* * * * *